United States Patent
Nishino

(10) Patent No.: US 6,753,926 B1
(45) Date of Patent: Jun. 22, 2004

(54) CIRCUIT FOR GENERATING SAMPLING CLOCK TO STABLY SAMPLE A VIDEO SIGNAL AND DISPLAY APPARATUS HAVING THE CIRCUIT

(75) Inventor: Masaaki Nishino, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/540,880

(22) Filed: Mar. 31, 2000

(30) Foreign Application Priority Data

Apr. 12, 1999  (JP) ........................................... 11/104618

(51) Int. Cl.$^7$ .......................... H04N 11/00; H03L 7/00
(52) U.S. Cl. ..................................... 348/537; 348/536
(58) Field of Search ................................ 348/537, 536, 348/540, 541, 505, 510; 345/213, 212, 99, 98

(56) References Cited

U.S. PATENT DOCUMENTS

| | | | | |
|---|---|---|---|---|
| 4,780,759 A | * | 10/1988 | Matsushima et al. | 331/20 |
| 5,450,137 A | * | 9/1995 | Rickard et al. | 331/1 A |
| 5,598,219 A | * | 1/1997 | Furuya et al. | 348/465 |
| 5,963,267 A | * | 10/1999 | Kranawetter | 348/537 |
| 6,043,803 A | * | 3/2000 | Shimizu | 345/213 |
| 6,097,444 A | * | 8/2000 | Nakano | 348/537 |
| 6,304,296 B1 | * | 10/2001 | Yoneno | 348/536 |
| 6,310,618 B1 | * | 10/2001 | Zhang et al. | 345/204 |
| 6,337,676 B1 | * | 1/2002 | Anai et al. | 345/89 |
| 6,452,592 B2 | * | 9/2002 | Zhang et al. | 345/204 |

FOREIGN PATENT DOCUMENTS

| | | |
|---|---|---|
| JP | 7-219485 | 8/1995 |
| JP | 2714302 | 10/1997 |
| JP | 10-112833 | 4/1998 |
| JP | 10-133619 | 5/1998 |
| JP | 10-161598 | 6/1998 |
| JP | 10-319917 | 12/1998 |
| JP | 11-088722 | 3/1999 |

OTHER PUBLICATIONS

Japanese Office Action dated Mar. 18, 2003, with English translations of perti nent portions.

* cited by examiner

Primary Examiner—Michael H. Lee
(74) Attorney, Agent, or Firm—Whitham, Curtis & Christofferson P.C.

(57) ABSTRACT

A liquid crystal display apparatus comprises a PLL circuit, a phase adjuster, a picture-data-sampling circuit, a liquid crystal display driver, a video signal processor, and a liquid crystal display panel. The phase adjuster comprises a delay circuit, a comparator, a counter, and a controller. The PLL generates a dot clock which is delayed by the delay circuit by a delay time designated by the controller to be a sampling clock. The counter counts the number of sampling edges of the sampling clock from a negative edge of a horizontal synchronization signal to a positive edge of a binarized video signal supplied from the comparator. The controller observes the number of sampling edges while adjusting the delay to determine the worst sampling clock and sets the best sampling clock whose phase is at a straight angle to the phase of the worst sampling clock.

14 Claims, 4 Drawing Sheets

CIRCUIT FOR GENERATING SAMPLING CLOCK TO STABLY SAMPLE A VIDEO SIGNAL AND DISPLAY APPARATUS HAVING THE CIRCUIT

BACKGROUND OF THE INVENTION

1. Field of the Invention

The present invention relates to a circuit for generating a sampling clock to stably sample a video signal and a display apparatus having the; circuit and in particular, to a circuit for generating a sampling clock to sample a video signal at the optimum timing to avoid edge business or jerkiness of a picture and a liquid crystal display apparatus.

2. Description of the Prior Art

Heretofore, a circuit for generating a sample clock used in a liquid crystal display apparatus which inputs a video signal from a personal computer adjusts a phase of the sampling clock in accordance with a switch operation by a user who intends to optimize the phase while watching the picture on the display panel. Such an adjustment is troublesome for the user. Therefore, automating the adjustment of a sample clock is required.

For example, JPA 10-161598 discloses a pixel synchronization apparatus in which a video signal is sampled with a sampling clock having a frequency multiple times as high as a reference clock, wherein a stable voltage period of the video signal is observed from the sampled video signal, and a phase of the sampling clock is adjusted.

FIG. 4 shows the structure of a liquid crystal display apparatus comprising the pixel synchronization apparatus disclosed in JPA 10-161598. Referring to FIG. 4, PLL (Phase-Locked Loop) circuit 1 outputs a reference clock which is synchronized with an input horizontal synchronization signal and is N times as high as a dot clock. Sampling circuit for detection 13 samples an analog video signal with the reference clock to output sampled data as DATA to stable-period-detecting circuit 14.

Stable-period-detecting circuit 14 detects whether a voltage of the sampled video signal varies and if the voltage does not vary, outputs a CS signal indicating a stable voltage period to controller 15. Controller 15 analyzes the CS signal and outputs a phase control signal for ensuring a setup time and a hold time in pixel data sampling circuit 3 to delay circuit 12. On the other hand, frequency divider 11 generates a first sampling clock having a frequency 1/N times as high as the reference clock to output the first sampling clock to delay circuit 12. Delay circuit 12 delays the first sampling clock by a delay time controlled by the phase control signal to output a second sampling clock SCLK to pixel-data-sampling circuit 3.

In the pixel synchronization apparatus disclosed in JPA 10-161598, although a quick adjustment to cope with a moving picture is realized, a disadvantage arises that an expensive PLL circuit and an expensive A/D converter, each of which operates at a frequency N times as high as a dot clock, are required. Moreover, because an internal operation frequency becomes high, another disadvantage arises that radiation of EMI noise increases.

SUMMARY OF THE INVENTION

In order to overcome the aforementioned disadvantages, the present invention has been made and accordingly, has an object to provide an inexpensive circuit for generating a sampling clock to stably sample a video signal which can automatically adjust a phase of the sampling clock without increasing the operation frequency thereof.

According to a first aspect of the present invention, there is provided a circuit for generating a sampling clock to stably sample a video signal in a pixel-data-sampling circuit, comprising: a sampling clock generator for generating a sampling clock which has the same frequency as a sampling frequency of the pixel-data-sampling circuit and is synchronized with a horizontal synchronization signal except for being delayed by a delay time designated by a control signal; a detector for detecting the worst sampling clock whose sampling edge coincides with a transition edge of the video signal; and means for generating the control signal to have the sampling clock generator generate the best sampling clock whose phase is at a straight angle to the phase of the worst sampling clock.

The sampling clock generator may comprise: a phase-locked loop for generating a dot clock which has the same frequency as the sampling frequency of the pixel-data-sampling circuit and is synchronized with the horizontal synchronization signal; and a delay circuit for delaying the dot clock by a delay time designated by the control signal to output a sampling clock which is delayed from the dot clock by the delay time.

The detector may comprise: a comparator for comparing a voltage of the video signal with a threshold voltage to output a binarized video signal; a counter for counting the number of sampling edges of the sampling clock from a positive edge of the horizontal synchronization signal to a positive edge of the binarized video signal; and a determiner for determining the worst sampling clock by examining the number of sample edges counted by the counter.

The detector may comprise: a comparator for comparing a voltage of the video signal with a threshold voltage to output a binarized video signal; a counter for counting the number of sampling edges of the sampling clock from a positive edge of the horizontal synchronization signal to a negative edge of the binarized video signal; and a determiner for determining the worst sampling clock by examining the number of sample edges counted by the counter.

The detector may comprise: a comparator for comparing a voltage of the video signal with a threshold voltage to output a binarized video signal; a counter for counting the number of sampling edges of the sampling clock from a negative edge of the horizontal synchronization signal to a positive edge of the binarized video signal; and a determiner for determining the worst sampling clock by examining the number of sample edges counted by the counter.

The detector may comprise: a comparator for comparing a voltage of the video signal with a threshold voltage to output a binarized video signal; a counter for counting the number of sampling edges of the sampling clock from a negative edge of the horizontal synchronization signal to a negative edge of the binarized video signal; and a determiner for determining the worst sampling clock by examining the number of sample edges counted by the counter.

The determiner may determine the worst sampling clock by detecting a delay of a sampling clock when the number of sampling edges is decremented by one while increasing the delay.

The determiner may determine the worst sampling clock by detecting a delay of a sampling clock when the number of sampling edges is incremented by one while decreasing the delay.

According to a second aspect of the present invention, there is provided a circuit for generating a sampling clock to stably sample a video signal in a pixel-data-sampling circuit, comprising: a sampling clock generator for generating a plurality of sampling clocks, each of which has the same frequency as a sampling frequency of the pixel-data-sampling circuit and is synchronized with a horizontal synchronization signal except for being delayed by a delay time, the delay times for a plurality of sampling clocks being shifted one another; a detector for detecting the worst sampling clock whose sampling edge coincides with a transition edge of the video signal among a plurality of sampling clocks; and means for selecting the best sampling clock whose phase is at a straight angle to the phase of the worst sampling clock among a plurality of sampling clocks.

The sampling clock generator may comprise: a phase-locked loop for generating a dot clock which has the same frequency as the sampling frequency of the pixel-data-sampling circuit and is synchronized with the horizontal synchronization signal; and a delay circuit for delaying the dot clock to output a plurality of sampling clocks which are delayed from the dot clock by delay times different from each other.

The detector may comprise: a comparator for comparing a voltage of the video signal with a threshold voltage to output a binarized video signal; a plurality of counters, each for counting the number of sampling edges of the corresponding sampling clock from a positive edge of the horizontal synchronization signal to a positive edge of the binarized video signal; and a determiner for determining the worst sampling clock by examining the number of sample edges counted by each counter.

The detector may comprise: a comparator for comparing a voltage of the video signal with a threshold voltage to output a binarized video signal; a plurality of counters, each for counting the number of sampling edges of the corresponding sampling clock from a positive edge of the horizontal synchronization signal to a negative edge of the binarized video signal; and a determiner for determining the worst sampling clock by examining the number of sample edges counted by each counter.

The detector may comprise: a comparator for comparing a voltage of the video signal with a threshold voltage to output a binarized video signal; a plurality of counters, each for counting the number of sampling edges of the corresponding sampling clock from a negative edge of the horizontal synchronization signal to a positive edge of the binarized video signal; and a determiner for determining the worst sampling clock by examining the number of sample edges counted by each counter.

The detector may comprise: a comparator for comparing a voltage of the video signal with a threshold voltage to output a binarized video signal; a plurality of counters, each for counting the number of sampling edges of the corresponding sampling clock from a negative edge of the horizontal synchronization signal to a negative edge of the binarized video signal; and a determiner for determining the worst sampling clock by examining the number of sample edges counted by each counter.

The determiner may determine the worst sampling clock by detecting a delay of a sampling clock when the number of sampling edges is decremented by one while the examined counter is shifted from the counter of a shorter delay time to the counter of a longer delay time.

The determiner may determine the worst sampling clock by detecting a delay of a sampling clock when the number of sampling edges is decremented by one while the examined counter is shifted from the counter of a longer delay time to the counter of a shorter delay time.

According to a third aspect of the present invention, there is provided a display apparatus, comprising: the above circuit for generating a sampling clock; a picture-data-sampling circuit for sampling a video signal with the sampling clock generated by the circuit for generating a sampling clock; a video signal processor for processing a sampled video signal; a driver for generating a drive signal on the basis of a vertical synchronization signal and a horizontal synchronization signal; and a display for displaying a picture on the basis of said sampled video signal by using said drive signal.

The display may be a liquid crystal display panel.

These and other objects, features and advantages of the present invention will become more apparent in the light of the following detailed description of the best mode embodiments thereof, as illustrated in the accompanying drawings.

DETAILED DESCRIPTION OF THE PREFERRED EMBODIMENT

Preferred modes of embodiment according to the present invention will be described with reference to the accompanying drawings.

Embodiment 1

Figure 1:
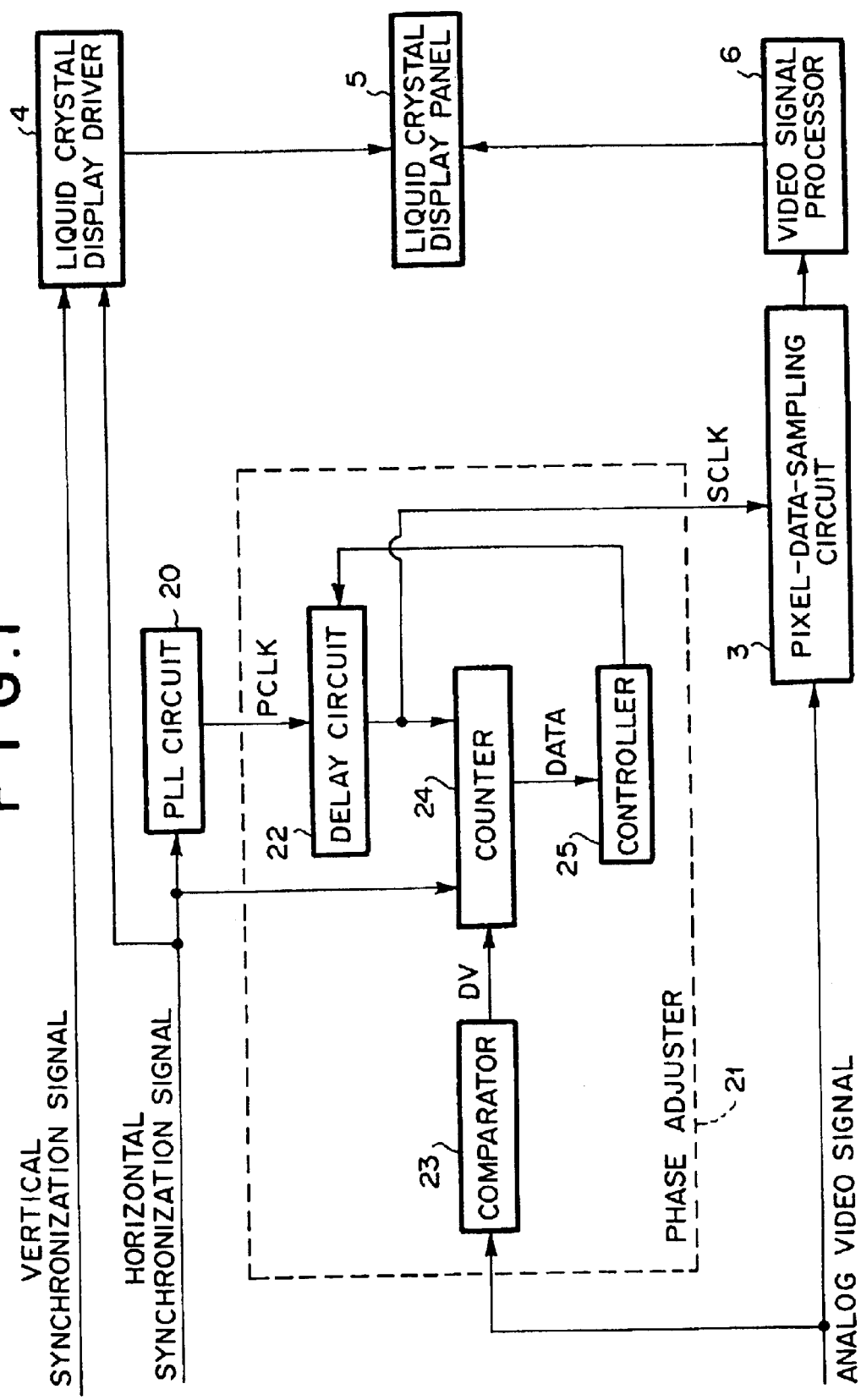
FIG. 1 is a block diagram showing the structure of a liquid crystal display apparatus comprising a circuit for generating a sampling clock to stably sample a video signal according to a first embodiment of the present invention.
Figure 4:
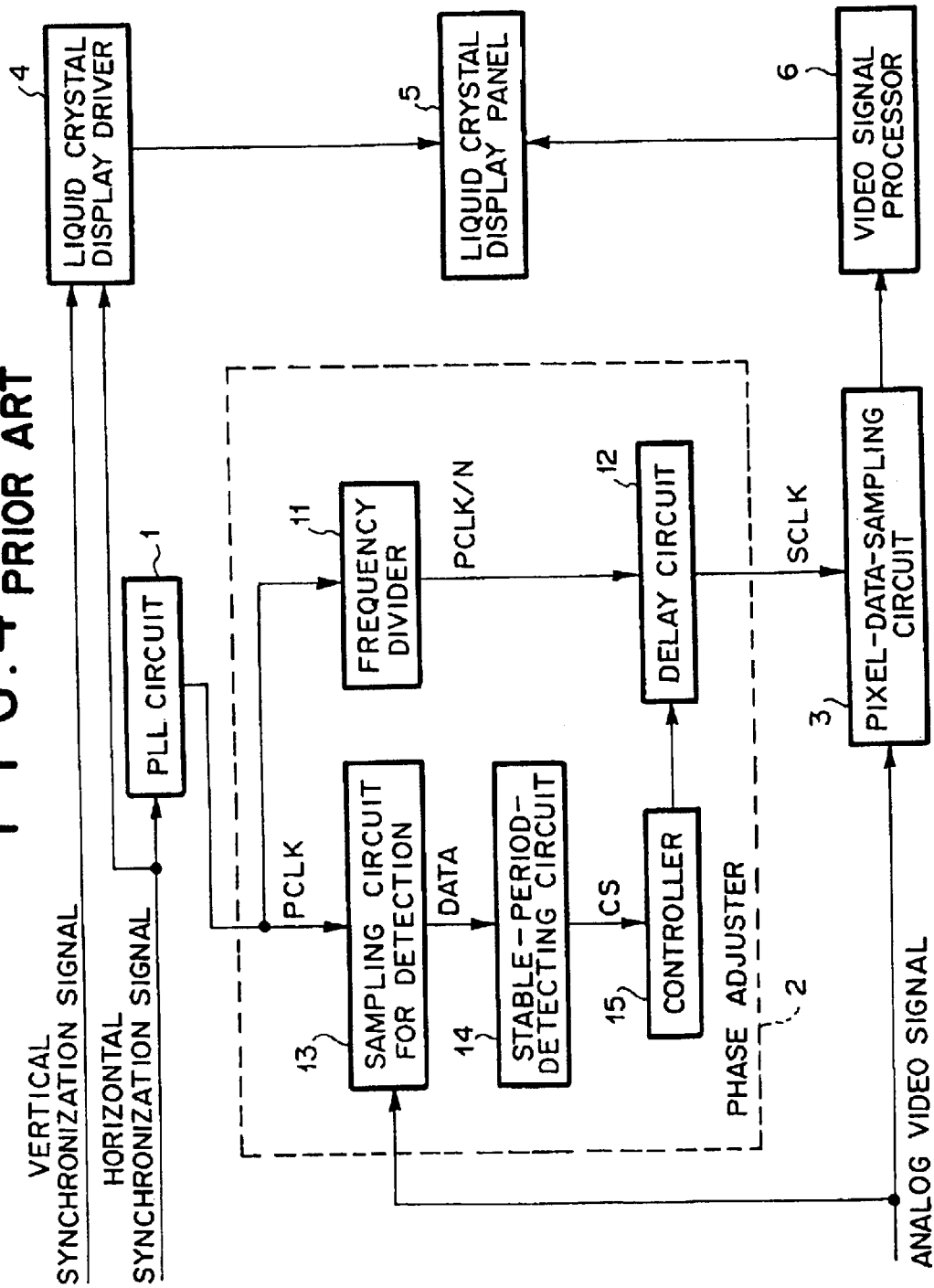
FIG. 4 is a block diagram showing the structure of a liquid crystal display apparatus comprising a pixel synchronization apparatus of the prior art.

The first embodiment will be explained with reference to FIGS. 1 and 2. In FIG. 1, the members which are the same as the members shown in FIG. 4 are represented by the same references as FIG. 4.

Referring to FIG. 1, the liquid crystal display apparatus according to the first embodiment comprises PLL circuit 20, phase adjuster 21, pixel-data-sampling circuit 3, liquid crystal display driver 4, liquid crystal display panel 5, and video signal processor 6.

PLL circuit 20 generates dot clock PCLK which is synchronized with a horizontal synchronization signal and has the same frequency as sampling frequency of pixel-data-sampling circuit 3. Phase adjuster 21 automatically adjusts a phase of the dot clock PCLK to generate sampling clock SCLK. Pixel-data-sampling clock 3 samples an analog video signal with sampling clock SCLK to output sampled video data. Liquid crystal display driver 4 outputs a liquid-crystal-display-driving signal in accordance with a vertical synchronization signal and the horizontal synchronization signal. Video signal processor 6 performs video signal process such as γ compensation and polarity inversion on the sampled video data. Liquid crystal display panel 5 displays a picture in accordance with the sampled video data by, using the liquid-crystal-display-driving signal. Here, picture-datasampling circuit 3, liquid crystal display driver 4, liquid crystal display panel 5, and video signal processor 6 are well-known to those skilled in the art and explanations thereof are omitted.

Phase adjuster 21 comprises delay circuit 22, comparator 23, counter 24, and controller 25. Delay circuit 22 delays dot clock-PCLK by time designated by controller 25 to output sampling clock SCLK to counter 24 and pixel-data-sampling circuit 3. Comparator 23 compares a voltage of the analog video signal, with a reference voltage to output binarized video signal, DV to counter 24. Counter 24 counts the number of positive edges of sampling clock SCLK from a negative edge of the horizontal synchronization signal to a positive edge of binarized video signal DV to output the counted number DATA to controller 25. Controller 25 measures counted number DATA for each sampling clock SCLK among sampling clocks SCLKs which are shifted in phase one after another, determines the worst delay time of sampling clock SCLK at which counted number DATA decreased from n+1 to n, calculates the best delay time having a phase shift at a straight angle to the phase of the worst delay time, and sets the best delay time to delay circuit 22.

Next, the operation of the first embodiment will be explained below.

First, the operation of counter 24 will be explained with reference to FIG. 2. Counter 24 counts the number of positive edges of sampling clock SCLK (FIG. 2(c)) from the negative edge of the horizontal synchronization signal (FIG. 2(a)) to the positive edge of binarized video signal DV (FIG. 2(b)).

Here, controller 25 measures sampling clock SCLK with counter 24 while controlling delay circuit 22 to vary the phase of sampling clock SCLK. Sampling clocks SCLKs which are delayed with a step of 1/m period of sampling clock SCLK one by one are represented by SCLK[0], SCLK[1], SCLK[2], . . . ,SCLK[m−1]. In FIG. 2, the value of m is eight and an the adjustment step of delay circuit 22 is one-eighth of a period of sampling clock SCLK. The finer the adjustment is, the more accurate the detected phase of sampling clock SCLK becomes. Alternation of the phase of sampling clock SCLK and the measurement of the number of the positive edges of sampling clock SCLK are executed every L line or every L frame. If they are executed every L line, a picture must have a vertical line at an arbitrary horizontal position. If they are executed every L frame, a picture must be stationary and they must be executed with respect to the same line.

Figure 2:
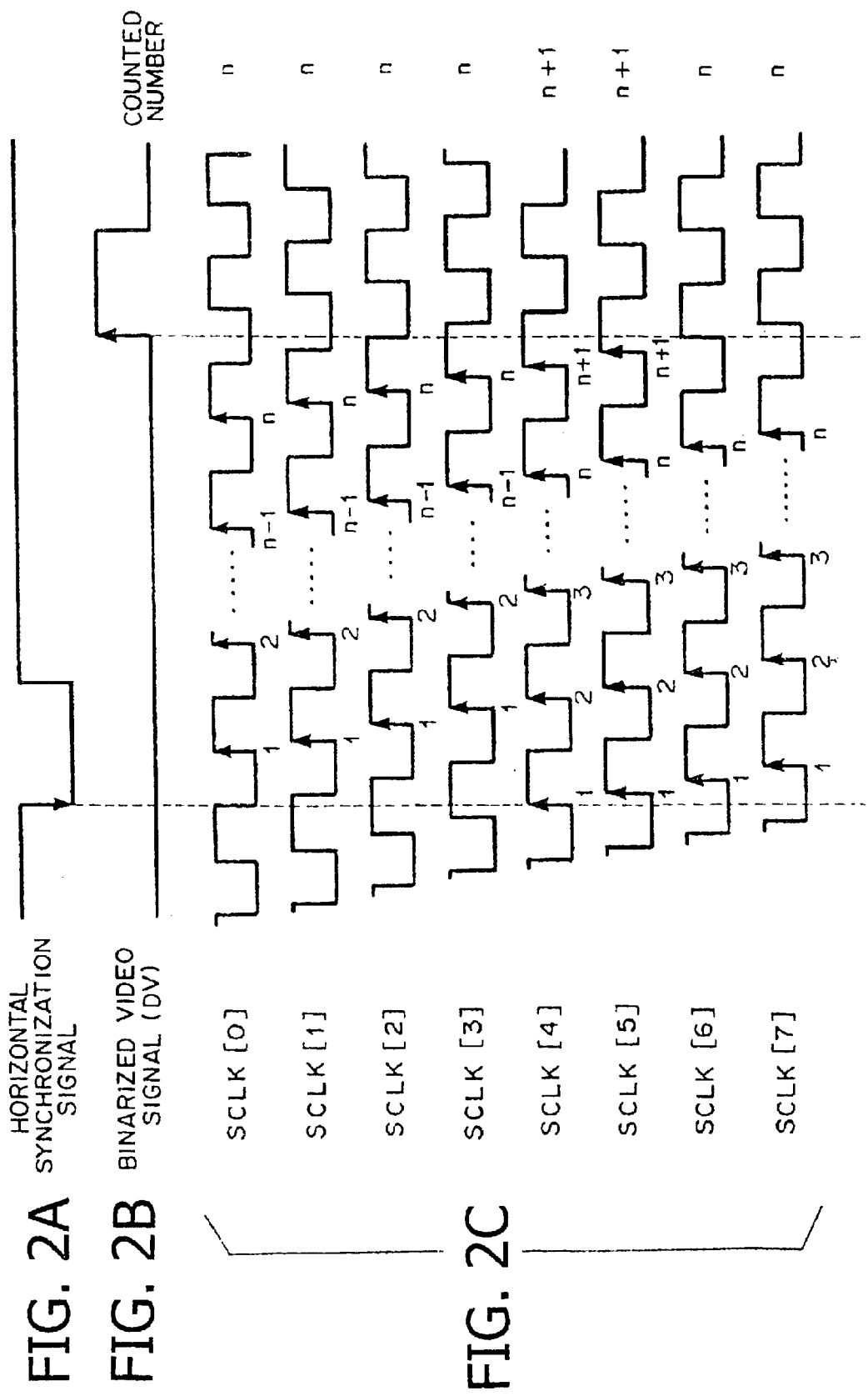
FIG. 2 is a timing diagram for explaining the operation of the circuit for generating a sampling clock to stably sample a video signal according to the first and a second embodiment of the present invention.

Comparison of counted numbers as shown in FIG. 2 with one another makes it apparent that when the phase of sampling clock SCLK is varied, counted number DATA varies between n and n+1. When sampling clock SCLK shifts from sampling clock SCLK[3] to sampling clock SCLK[4], the counted number DATA shifts from n to n+1. When sampling clock SCLK is SCLK[4], the negative edge of the horizontal synchronization signal (FIG. 2(a)) coincides with a positive edge of sampling clock SCLK. On the other hand, when sampling clock SCLK shifts from sampling clock SCLK[5] to sampling clock SCLK[6], the counted number DATA shifts from n+1 to n. When sampling clock SCLK is SCLK[6], the positive edge of binarized video signal DV (FIG. 2(b)) coincides with a positive edge of sampling clock SCLK.

The best relation in phase between sampling clock SCLK and the analog video signal is realized when a positive edge of sampling clock SCLK is located at the middle of a pixel data of binarized video signal DV, that is, when sampling clock SCLK is sampling clock SCLK[2]. The phase of sampling clock SCLK[2] is at a straight angle to the phase of sampling clock SCLK[6] or a time difference between sampling clock SCLK[2] and sampling clock SCLK[6] is a half of the period of sampling clock SCLK. Therefore, controller 25 determines the worst delay time of sampling clock SCLK at which counted number shifts from n+1 to n, calculates the best delay time which has a time difference equal to a half of the period of sampling clock SCLK from the worst delay time, and sets the best delay time to delay circuit 22. Thus, each positive edge of sampling clock SCLK is set at the middle of each pixel of binarized video signal DV.

Embodiment 2

Figure 3:
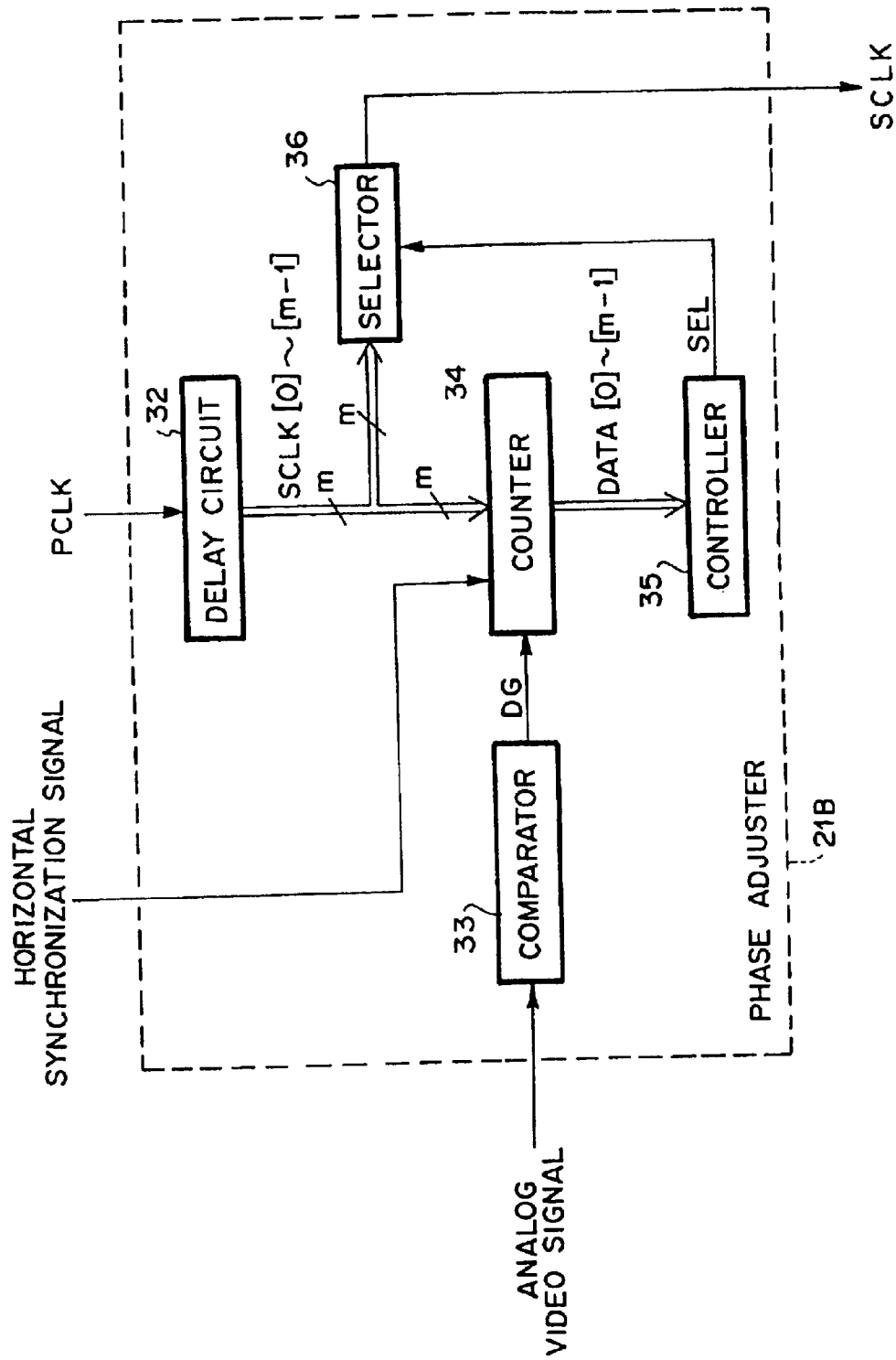
FIG. 3 is a block diagram showing the structure of a phase adjuster in a circuit for generating a sampling clock to stably sample a video signal according to the second embodiment of the present invention.

Next, the second embodiment of the present invention will be explained with reference to FIG. 3.

The basic structure of the second embodiment is similar to the first embodiment. However, delay circuit 22, counter 24, and controller 25 are replaced by delay circuit 32, counter set 34, and controller 35, respectively and selector 36 is added.

Delay circuit 32 simultaneously outputs sampling clocks SCLK[0] . . . SCLK[m−1] as explained in the first embodiment from taps thereof. Sampling clocks SCLK[0] . . . SCLK[m−1] are simultaneously supplied to counter set 34 and selector 36.

Counter set 34 comprises counters as many as m, each of which counts the number of positive edges of sampling clock SCLK[i] (i=0, 1, 2, . . . , m−1). Counted numbers DATA[0] . . . DATA[m−1] corresponding to sampling clocks SCLK[0] . . . SCLK[m−1], respectively, are simultaneously supplied to controller 35. Controller 35 determines the worst sampling clock SCLK[i] which has the worst delay time. The counted number DATA corresponding to SCLK[i−1] is n+1, and the counted number DATA corresponding to SCLK[i] is n. Sampling clock SCLK[i] is determined by examining the counted number DATA[0] . . . DATA[m−1] in an ascending order or in an descending order. When counted number DATA[0] . . . DATA[m−1] are examined in an ascending order, sampling clock SCLK[i] is detected when the counted number DATA is decremented by one. When counted number DATA[0] . . . DATA[m−1] are examined in an descending order, sampling clock SCLK[i] is detected when the counted number DATA is incremented by one. Then, controller 35 determines the best sampling clock SCLK[j] having a delay time which is different from a delay time of the worst sampling clock SCLK[i] by a half period of sampling clock SCLK. Thereafter, controller 35 outputs selection signal SEL for selecting sampling clock SCLK[j] to selector 36. Selector 36 selects sampling clock SCLK[j] among sampling clocks SCLK[0] . . . SCLK[m−1] in accordance with selection signal SEL.

In the above explanation, a counted number is obtained by counting positive edges of sampling clock SCLK from a negative edge of a horizontal synchronization signal to a positive edge of a binaraized video signal DV. Alternatively, a counted number may be obtained by counting positive edges of sampling clock SCLK from a negative edge of a horizontal synchronization signal to a negative edge of a binaraized video signal DV because positive edges of a binarized video signal DV and negative edges of the binarized video signal DV are arranged in the intervals of sampling clock SCLK. In addition, a counted number may be obtained by counting positive edges of sampling clock SCLK from a positive edge of a horizontal synchronization signal to a positive or negative edge of a binarized video signal DV because replacement of a negative edge of a horizontal synchronization signal to a positive edge of the horizontal synchronization signal does not affect the transition point of a counted number from n+1 to n.

In the above explanation, it was assumed that pixel-data-sampling circuit 3 samples an analog video signal at a positive edge of a sampling clock SCLK. Alternatively, if pixel-data-sampling circuit 3 samples an analog video signal at a negative edge of a sampling clock SCLK, a counted number must be obtained by counting negative edges of sampling clock SCLK from a positive or negative edge of a horizontal synchronization signal to a positive or negative edge of a binarized video signal DV. Therefore, a positive edge of a sampling clock SCLK and a negative edge of the sampling clock SCLK are generalized to a sampling edge of the sampling clock SCLK.

In the above explanation, the worst sampling clock was detected when the counted number DATA is decremented by one while increasing the delay of sampling clock SCLK. However, the worst sampling clock may be detected when the counted number DATA is incremented by one while decreasing the delay of sampling clock SCLK.

According to the second embodiment, all the counted numbers are simultaneously measured and accordingly, the automatic adjustment of the phase of sampling clock SCLK is performed in real time to cope with a moving picture.

As explained above, according to the present invention, because the phase adjuster automatically adjusts the phase of a sampling clock to the best phase for an input analog video signal, a manual adjustment of the phase of the sampling clock is not required to obtain a normal picture on a liquid crystal display panel. In addition, because a PLL circuit and an A/D converter, each of which operates at a frequency multiple times the frequency of the dot clock, and a memory for storing sampled data are not required, a liquid crystal display panel can be manufactured in low cost. Further, because the phase adjuster does not use the output of the picture-data sampling circuit, the picture data sampling circuit is not needed to be an A/D converter. Therefore, the phase adjuster may be used in an analog liquid crystal display apparatus which drives each pixel by a sampled analog video signal.

Although the present invention has been shown and explained with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. A circuit for generating a sampling clock to stably sample a video signal in a pixel-data-sampling circuit, comprising:
   a sampling clock generator for generating a sampling clock which has the same frequency as a sampling frequency of said pixel-data-sampling circuit and is synchronized with a horizontal synchronization signal except for being delayed by a delay time designated by a control signal;
   a detector for detecting a worst sampling clock whose sampling edge coincides with a transition edge of the video signal, which comprises:
      a comparator for comparing a voltage of said video signal with a threshold voltage to output a binarized video signal;
      a counter for counting of sampling edges of the sampling clock from any one of positive and negative edges of said horizontal synchronization signal to a positive edge of said binarized video signal; and
      a determiner for determining said worst sampling clock by examining the number of sample edges counted by said counter; and
   means for generating said control signal to have said sampling clock generator generate a best sampling clock whose phase is at a straight angle to the phase of said worst sampling clock, wherein
   said sampling clock generator comprises:
      a phase-locked loop for generating a dot clock which has the same frequency as the sampling frequency of said pixel-data-sampling circuit and is synchronized with said horizontal synchronization signal; and
      a delay circuit for delaying said dot clock by a delay time designated by said control signal to output a sampling clock which is delayed from said dot clock by said delay time.

2. The circuit for generating a sampling clock according to claim 1, wherein said determiner determines said worst sampling clock by detecting a delay of a sampling clock when the number of sampling edges is decremented by one while increasing the delay.

3. The circuit for generating a sampling clock according to claim 1, wherein said determiner determines said worst sampling clock by detecting a delay of a sampling clock when the number of sampling edges is incremented by one while decreasing the delay.

4. A circuit for generating a sampling clock to stably sample a video in a pixel-data-sampling circuit, comprising:
   a sampling clock generator for generating a plurality of sampling clocks comprises
   a phase-locked loop for generating a dot clock which has the same frequency as the sampling frequency of said pixel-data-sampling circuit and is synchronized with said horizontal synchronization signal; and
   a delay circuit for delaying said dot clock to output said plurality of sampling clocks which are delayed from said dot clock by delay times different from each other, wherein each of said sampling clock generator has the same frequency as a sampling frequency of said pixel-data-sampling circuit and is synchronized with a horizontal synchronization signal except for being delayed by a delay time, said delay time for a plurality of sampling clocks being shifted one another;
   a detector for detecting a worst sampling clock whose sampling edge coincides with a transition edge of the video signal among said plurality of sampling clocks, which comprises:
      a comparator for comparing a voltage of said video signal with a threshold voltage to output a binarized video signal;
      a plurality of counters, each for counting the number of sampling edges of the corresponding sampling clock from any one of positive and negative edges of said horizontal synchronization signal to a positive edge of said binarized video signal;
      a determiner for determining said worst sampling clock by examining the number of sample edges counted by each counter; and
   means for selecting a best sampling clock whose phase is at a straight angle to the phase of said worst sampling clock among said plurality of sampling clocks.

5. The circuit for generating a sampling clock according to claim 4, wherein said determiner determines said worst sampling clock by detecting a delay of a sampling clock when the number of sampling edges is decremented by one while the examined counter is shifted from the counter of a shorter delay time to the counter of a longer delay time.

6. The circuit for generating a sampling clock according to claim 4, wherein said determiner determines said worst sampling clock by detecting a delay of a sampling a sampling clock when the number of sampling edges is decremented by one while the examined counter is shifted from the counter of a longer delay time to the counter of a shorter delay time.

7. A display apparatus, comprising:
a circuit for generating a sampling clock;
a picture-data-sampling circuit for sampling a video signal with a sampling clock generated by a sampling clock generator,
means for generating said control signal to have said sampling clock generator generate a best sampling clock whose phase is at a straight angle to the phase of said worst sampling clock;
a video signal processor for processing a sampled video signal;
a driver for generating a drive signal on the basis of a vertical synchronization signal and a horizontal synchronization signal; and
a display for displaying a picture on the basis of said sampled video signal by using said drive signal, wherein said circuit for generating a sampling clock comprises:
the sampling clock generator for generating a sampling clock
a detector for detecting a worst sampling clock whose sampling edge coincides with a transition edge of the video signal, which comprises:
a comparator for comparing a voltage of said video signal with a threshold voltage to output a binirized video signal;
a counter for counting of sampling edges of the sampling clock from any one of positive and negative edges of said horizontal synchronization signal to any one of positive and negative edges of said binarized video signal; and
a determiner for determining said worst sampling clock by examining the number of sample edges counted by said counter; and
means for generating said control signal to have said sampling clock generator generate a best sampling clock whose phase is at a strait angle to the phase of said worst sampling clocks wherein
said sampling clock generator comprises:
a phase-licked loop for generating a dot clock which has the same frequency as the sampling frequency of said pixel-data-sampling circuit and is synchronized with said horizontal synchronization signal; and
a delay circuit for delaying said dot clock by a delay time designated by said control signal to output a sampling clock which is delayed from said dot clock by said delay time.

8. The display apparatus according to claim 7, wherein said display is a liquid crystal display panel.

9. A display apparatus, comprising:
a circuit for generating a sampling clock;
a picture-data-sampling circuit for sampling a video signal with a sampling clock generated by a sampling clock generator,
a video signal processor for processing a sampled video signal;
a driver for generating a drive signal on the basis of a vertical synchronization signal and a horizontal synchronization signal; and
a display for displaying a picture on the basis of said sampled video signal by using and drive signal, wherein said circuit for generating a sampling clock comprises:
the sampling clock generator for generating a plurality of sampling clock; and
a delay circuit for delaying said dot clock to output said plurality of sampling clocks which are delayed from said dot clock by delay times different from each other, said elay time for a plurality of sampling clocks being shifted one another;
a detector for detecting a worst sampling clock whose sampling edge coincides with a transition edge of the video signal among said plurality of sampling clocks, which comprises:
a comparator for comparing a voltage of said video signal with a threshold voltage to output a binirized video signal;
a plurality of counters, each for counting the number of sampling edges of the corresponding sampling clock from any one of positive and negative edges of said horizontal synchronization signal to any one of positive and negative edges of said binarized video signal; and
a determiner for determining said worst sampling clock by examining the number of sample edges counted by each counter; and
means for selecting a best sampling clock whose phase is at a straight angle to the phase of said worst sampling clock among said plurality of sampling clocks.

10. The display apparatus according to claim 9, wherein said display is a liquid crystal display panel.

11. The display apparatus according to claim 7, wherein said determiner determines said worst sampling clock by detecting a delay of a sampling clock when the number of sampling edges is decremented by one while increasing the delay.

12. The display apparatus according to claim 7, wherein said determiner determines said worst sampling clock by detecting a delay of a sampling clock when the number of sampling edges is incremented by one while decreasing the delay.

13. The display apparatus according to claim 9, wherein
said determiner determines said worst sampling clock by detecting a delay of a sampling clock when the number of sampling edges is decremented by one while the examined counter is shifted from the counter of a shorter delay time to the counter of a longer delay time.

14. The display apparatus according to claim 9, wherein
said determiner determines said worst sampling clock by detecting a delay of a sampling clock when the number of sampling edges is decremented by one while the examined counter is shifted from the counter of a longer delay time to the counter of a shorter delay time.

* * * * *